(12) United States Patent
Tamura

(10) Patent No.: US 7,768,332 B2
(45) Date of Patent: Aug. 3, 2010

(54) WAVEFORM GENERATION APPARATUS, SETUP CYCLE CORRECTION METHOD AND SEMICONDUCTOR TEST APPARATUS

(75) Inventor: Kenji Tamura, Tokyo (JP)

(73) Assignee: Advantest Corp., Tokyo (JP)

( * ) Notice: Subject to any disclaimer, the term of this patent is extended or adjusted under 35 U.S.C. 154(b) by 379 days.

(21) Appl. No.: 11/811,514

(22) Filed: Jun. 11, 2007

(65) Prior Publication Data

US 2008/0297222 A1 Dec. 4, 2008

(30) Foreign Application Priority Data

May 29, 2007 (JP) .............................. 2007-141990

(51) Int. Cl.
*G06F 1/04* (2006.01)
*H03K 3/00* (2006.01)

(52) U.S. Cl. ...................................... 327/291; 327/551
(58) Field of Classification Search ................. 327/291, 327/551
See application file for complete search history.

(56) References Cited

U.S. PATENT DOCUMENTS 6,255,882 B1 * 7/2001 Hirai .......................... 327/291

FOREIGN PATENT DOCUMENTS

| EP | 1610137 A1 | 12/2005 |
| JP | 04-079545 | 3/1992 |
| WO | WO 2006/058082 A1 | 6/2006 |

OTHER PUBLICATIONS

U. Tietze, Ch. Schenk "Halbleiter-Schaltungstechnik", Springer-Verlag, 1999, Seiten 1284-1295.

* cited by examiner

*Primary Examiner*—Lincoln Donovan
*Assistant Examiner*—John W Poos
(74) *Attorney, Agent, or Firm*—Muramatsu & Associates

(57) ABSTRACT

Spurious noise that occurs in the vicinity of a carrier can be removed even when a high-resolution cycle is set, thereby realizing low jitters in a high-precision variable clock signal. Cycle data that is set by a pattern generator in a waveform generation apparatus (a semiconductor test apparatus) is corrected in such a manner that spurious noise that occurs in a carrier of a high-precision variable clock is produced at a position far from the carrier in terms of frequency. As a result, the spurious noise can be assuredly removed by a phase-locked loop circuit, thereby realizing low jitters in the high-precision variable clock signal.

8 Claims, 13 Drawing Sheets

FIG.3

| | $2^3$ | $2^2$ | $2^1$ | $2^0$ | ... | $2^{-7}$ | ... | $2^{-14}$ | ... | $2^{-21}$ | $2^{-22}$ | $2^{-23}$ | $2^{-24}$ | $2^{-25}$ |
|---|---|---|---|---|---|---|---|---|---|---|---|---|---|---|
| 8ns | 1 | 0 | 0 | 0 | ... | 0 | ... | 0 | ... | 0 | 0 | 0 | 0 | 0 |
| 9ns | 1 | 0 | 0 | 1 | ... | 0 | ... | 0 | ... | 0 | 0 | 0 | 0 | 0 |
| $8ns+2^{-25}ns$ | 1 | 0 | 0 | 0 | ... | 0 | ... | 0 | ... | 0 | 0 | 0 | 0 | 1 |
| $8ns+2^{-7}ns+2^{-25}ns$ | 1 | 0 | 0 | 0 | ... | 1 | ... | 0 | ... | 0 | 0 | 0 | 0 | 1 |
| $8ns+4ns+1ns+2^{-7}ns+2^{-14}ns$ | 1 | 1 | 0 | 1 | ... | 1 | ... | 1 | ... | 0 | 0 | 0 | 0 | 0 |

WAVEFORM GENERATION APPARATUS, SETUP CYCLE CORRECTION METHOD AND SEMICONDUCTOR TEST APPARATUS

BACKGROUND OF THE INVENTION

1. Field of the Invention

The present invention relates to a waveform generation apparatus including a pattern generator, a setup cycle correction method that corrects a setup cycle of the pattern generator, and a semiconductor test apparatus including the waveform generation apparatus. More particularly, it relates to a waveform generation apparatus which moves spurious noise produced in the vicinity of a carrier in an output signal from a timing generator included in the waveform generation apparatus so as to be distant from the carrier in terms of frequency, with the result that the spurious noise can be removed by a PLL (phase locked loop) provided in the waveform generation apparatus, a setup cycle correction method, and a semiconductor test apparatus.

2. Description of the Related Art

In general, a semiconductor test apparatus supplies a test pattern of a frequency in accordance with an operating frequency of an electronic device to the electronic device to perform a test. Furthermore, when the electronic device as a test target has a plurality of cores having different operating frequencies, the respective cores are sequentially tested.

Meanwhile, in order to perform the test of the electronic device in detail, it is necessary to perform the test while the plurality of cores are simultaneously operated. Therefore, the conventional semiconductor test apparatus generates a plurality of clocks in accordance with respective operating frequencies of the plurality of cores and simultaneously operates the cores based on the plurality of generated clocks to perform the test.

In recent years, a test of supplying the plurality of clocks to the respective cores in the electronic device in synchronization with each other (a multitime domain) is conducted. This is a test which is performed for a device having a plurality of different interface speeds.

FIG. 9 shows a structure of this type of multitime domain test apparatus (a waveform generation apparatus).

It is to be noted that the waveform generation apparatus depicted in FIG. 9 is mounted in a semiconductor test apparatus in order to perform the multitime domain test.

As shown in the drawing, a waveform generation apparatus (a semiconductor test apparatus) 100 includes a pattern generator 110, a timing generator 120, and a PLL 130.

Here, the pattern generator 110 generates a cycle pattern based on a setup cycle.

The timing generator 120 outputs the cycle pattern input from the pattern generator 110 as a high-precision variable clock based on a reference clock.

It is to be noted that various improvements have been proposed for the pattern generator or the timing generator, for example, as disclosed by Japanese Patent Application No. 79545-1992.

The PLL (Phase Locked Loop) 130 removes spurious noise from the high-precision variable clock output from the timing generator 120.

Here, the spurious noise means an unnecessary component produced in a signal (in this specification, the high-precision variable clock).

A cause of the occurrence of this spurious noise will now be explained with reference to FIGS. 10 to 13.

As shown in FIG. 10, the timing generator 120 has delay circuits 121-1 to 121-$n$ in units of the reference clock, and a high-precision variable delay circuit 122. Here, the timing generator 120 integrates a phase with respect to the reference clock every time it receives a cycle pattern signal, and switches the delay circuits 121-1 to 121-$n$ to corresponding one in real time.

Furthermore, as shown in FIG. 11, when a difference from the setup cycle with respect to an integral multiple of a reference clock cycle is sufficiently small, a delay path varies every time the integrated phase reaches a resolution $\alpha$ concerning the setup cycle of the timing generator, and a phase error also fluctuates. Moreover, when the integrated phase reaches the reference clock cycle, an amount corresponding to a cycle is subtracted, thereby realizing a delay of one cycle. When a phase fluctuation in accordance with the setup cycle periodically occurs, the spurious noise is produced.

It is to be noted that a position of the produced spurious noise with respect to a carrier can be obtained from fluctuation cycles T1 and T2 of the phase error depicted in FIG. 11.

Now, the fluctuation cycle T1 will be explained with reference to FIG. 12.

As shown in the drawing, for example, when a reference clock cycle is 4 ns and a RATE cycle set value is 9 ns (=4×2+$2^0$ ns), a cycle pattern having a cycle of 8 ns is output from the pattern generator 110, clocks which are delayed by 0 ns at first, delayed by 1 ns at second, delayed by 2 ns at third, and delayed by 3 ns at fourth with respect to the cycle pattern are output from the timing generator. Then, although a clock is delayed by 4 ns at fifth, this is the same as a reference clock cycle, and hence an amount corresponding to this cycle is subtracted, thereby delaying one cycle. That is, since a timing error fluctuates with a cycle of T1≈0.36 ns, spurious noise occurs at a position of 1/T1 with respect to a fundamental frequency.

The fluctuation cycle T2 will now be explained with reference to FIG. 13.

As shown in the drawing, in a case where a reference clock cycle is 4 ns and a RATE frequency set value is 8.0000001192092 ns (=4×2+$2^{-23}$ ns), if a resolution concerning a setup cycle of the timing generator is $2^{-7}$ ns, a cycle pattern having a cycle of 8 ns is output from the pattern generator 110, and a clock whose delay amount is 0 ns from the first to the ($2^{16}$−1) outputs is output from the timing generator 120. Further, the delay becomes $2^{-7}$ ns at the next $2^{16}$ output, a delay path varies in accordance with the cycle T2≈0.524 ms from the first to $2^{16}$ output, and a phase error also fluctuates. That is, since a timing error fluctuates with the cycle of T2, spurious noise occurs at a position of 1/T2 with respect to a fundamental frequency.

Furthermore, the above-explained spurious noise is removed by the PLL provided in the waveform generation apparatus.

However, the spurious noise removed by the PLL is limited to spurious noise that occurs at a position far from a carrier. That is because a loop filter of the PLL is a low-pass filter, and hence a phase fluctuation of a frequency having a higher rate is apt to be attenuated and an output hardly follows up this attenuation.

Therefore, when a phase of the setup cycle with respect to an integral multiple of a reference clock is large like an example where the setup cycle is 9 ns, since the spurious noise occurs at a position far from the carrier, the PLL can remove the spurious noise. However, when a phase of the setup cycle with respect to an integral multiple of the reference clock is small like an example where the setup cycle is 8.0000001192092 ns, since the spurious noise occurs in the vicinity of the carrier, the PLL can hardly remove the spurious noise.

Such a problem does not occur until a test requiring setting a high-resolution cycle is carried out.

In a conventional test of individually testing respective cores in an electronic device, an operating frequency is generated in accordance with each core. In this case, since a resolution of the cycle setting is low, the spurious noise occurs at a position far from the carrier, e.g., a position of several-ten kHz to several-hundred kHz. Therefore, the PLL can sufficiently remove the spurious noise.

However, in a test requiring setting a high-resolution cycle like a multitime domain, a since a plurality of clocks are synchronized with each core, a resolution of the cycle setting is increased. Then, as shown in FIG. 9, the spurious noise occurs at a position close to the carrier, i.e., a position of several-ten. Hz to several kHz, the PLL cannot remove the spurious noise and outputs it as it is.

Here, as a method of removing (increasing attenuation of) the spurious noise in the vicinity of the carrier, narrowing a loop band of a loop filter 132 can be considered. However, this method has a drawback that frequency switching characteristics are deteriorated when the loop band is narrowed.

Furthermore, since characteristics of a voltage controlled oscillator itself can be more directly reproduced, a caution is required when phase noise of the voltage controlled oscillator is large.

Therefore, the loop band must be subjected to trade-off in accordance with a required specification, e.g., spurious or switching characteristics, and the loop band cannot be reduced limitlessly.

SUMMARY OF THE INVENTION

In view of the above-explained problem, it is an object of the present invention to provide a waveform generation apparatus that can remove spurious noise which occurs in the vicinity of a carrier even when setting a high-resolution cycle and realize low jitters of a high-precision variable clock signal, a setup cycle correction method, and a semiconductor test apparatus.

To achieve this object, according to the present invention, there is provided a waveform generation apparatus comprising: a pattern generator that generates a cycle pattern; a timing generator that outputs a clock signal based on the cycle pattern and a reference clock; and a phase-locked loop circuit that removes spurious noise from the clock signal, wherein the pattern generator has a cycle setter that sets a generation cycle of the clock signal as cycle data, and the cycle setter sets cycle data corrected in such a manner that the spurious noise occurs at a position where it is removable by the phase-locked loop circuit.

In the waveform generation apparatus noted above, since the cycle data is corrected in such a manner that the spurious noise which occurs in a high-precision variable clock (the clock signal) can be removed by the phase-locked loop circuit, the spurious noise can be assuredly removed even if a high-resolution cycle is set, thereby realizing low jitters of the clock signal.

Here, allowing occurrence of the spurious noise at the position where this noise can be removed by the phase-lock loop circuit means allowing occurrence of the spurious noise at a position far from a carrier of the clock signal by a predetermined frequency or more.

Further, according to the waveform generation apparatus of the present invention, the cycle setter sets cycle data corrected in such a manner that a position of the spurious noise which occurs when the clock signal has the slowest cycle becomes a position where removal of the spurious noise by the phase-locked loop circuit is possible.

Since the waveform generation apparatus adopts such a structure, the spurious noise can occur at a position where it can be removed by the phase-locked loop circuit even if a cycle of the clock signal has the lowest rate.

When the cycle of the clock signal becomes slow, a fluctuation cycle of a phase error also becomes slow. Since an inverse number of this phase fluctuation cycle corresponds to a position at which the spurious noise occurs, the spurious noise occurs at a position closer to the carrier as the cycle of the clock signal becomes slower. Here, when the spurious noise is produced at a position far from the carrier even though the clock signal has the slowest cycle, the spurious noise does not occur at a position closer to the carrier, thereby removing the spurious noise by the phase-locked loop without fail. As a result, low jitters of the high-precision variable clock signal can be realized.

Moreover, according to the waveform generation apparatus of the present invention, the cycle setter sets cycle data corrected in such a manner that an inverse number of a cycle of a phase fluctuation which occurs in the timing generator becomes larger than a minimum value of a position where the spurious noise is removable by the phase-locked loop circuit.

In the waveform generation apparatus has such a noted above, since the spurious noise occurs with a value of the inverse number of the phase fluctuation cycle, the spurious noise can be produced at a position where it can be removed by the phase-locked loop circuit, thereby assuredly removing the spurious noise.

Additionally, according to the waveform generation apparatus of the present invention, a cycle of a reference clock that is input by the timing generator and serves as a reference for an output timing of the clock signal is determined as a reference clock cycle, a phase of a cycle of the cycle data with respect to an integral multiple of the reference clock cycle is calculated, the reference clock cycle is divided by the phase, a quotient obtained by the division is multiplied by the cycle of the cycle data, and a product obtained by the multiplication is determined as a cycle of the phase modulation.

In a case where the waveform generation apparatus has such a configuration, when a phase error fluctuates at the moment the integrated phase reaches the reference clock cycle, the spurious noise based on cycle properties of this phase fluctuation can be assuredly removed.

Further, according to the waveform generation apparatus of the present invention, the cycle data is corrected based on a value of C1 when a position (1/T1) of the spurious noise that occurs in the clock signal satisfies the following expression:

$$1/T1=1/(A \times B/C1) > D$$

where A: the slowest cycle of the clock signal
B: the reference clock cycle
C1: the phase
D: a minimum value of a position where the spurious noise is removable by the phase-locked loop circuit.

Since the waveform generation apparatus has such a structure, setting the cycle data corrected based on a delay time with respect to the reference in the pattern generator allows occurrence of the spurious noise at a position far from the carrier, thus enabling to remove the spurious noise by the phase-locked loop circuit.

Furthermore, according to the waveform generation apparatus of the present invention, a cycle of a reference clock that is input by the timing generator and serves as a reference for an output timing of the clock signal is determined as a reference clock cycle, a phase of a cycle of the cycle data with respect to an integral multiple of the reference clock cycle is calculated, a resolution concerning a setup cycle of the timing generator is divided by the phase, a quotient obtained by the division is multiplied by the cycle of the cycle data, and a product obtained by the multiplication is determined as a cycle of the phase fluctuation.

In a case where the waveform generation apparatus has such a structure, when a phase error fluctuates at the moment the integrated phase reaches the resolution of the timing generator, the spurious noise based on cycle properties of this phase fluctuation can be assuredly removed.

Further, according to the waveform generation apparatus of the present invention, the cycle data is corrected based on a value of C2 when a position (1/T2) of the spurious noise that occurs in the clock signal satisfies the following expression:

$$1/T2=1/(A\times E/C2)>D$$

where A: the slowest cycle of the clock signal
E: the resolution concerning the setup cycle of the timing generator
C2: the phase
D: a minimum value of a position where the spurious noise is removable by the phase-locked loop circuit.

In a case where the waveform generation apparatus adopts such a structure, when the cycle data corrected based on a delay time with respect to the reference is set in the pattern generator, the spurious noise occurs at a position far from the carrier, thereby removing the spurious noise by the phase-locked loop circuit.

Furthermore, according to the present invention, there is provided a setup cycle correction method of correcting cycle data that is set by a pattern generator in a waveform generation apparatus, wherein the cycle data is corrected in such a manner that spurious noise which occurs in a clock signal output from a timing generator in the waveform generation apparatus is produced at a position where the spurious noise is removable by a phase-locked loop circuit in the waveform generation apparatus, and the corrected cycle data is set in the pattern generator.

In the setup cycle correction method noted above, since the spurious noise occurs at a position far from the carrier, it can be removed by the phase-locked loop circuit, thereby realizing low jitters of the clock signal.

Moreover, according to the present invention, there is provided a semiconductor test apparatus including a waveform generation apparatus that outputs a clock signal with a predetermined cycle, wherein the waveform generation apparatus is constituted of the waveform generation apparatus as described in the foregoing.

If the semiconductor test apparatus adopts such a structure, low jitters of the clock signal can be realized in the waveform generation apparatus even when this semiconductor test apparatus sets a high-resolution cycle.

As explained above, according to the present invention, since the spurious noise that occurs in the clock signal output from the timing generator in the waveform generation apparatus can be produced at a position far from the carrier, this spurious noise can be assuredly removed by the phase-locked loop circuit.

Therefore, even if a high-resolution cycle is set, low jitters of the high-precision variable clock signal can be realized.

BRIEF DESCRIPTION OF THE DRAWINGS

FIG. 3 is a diagram showing an example of an input to a cycle setter;

DETAILED DESCRIPTION OF THE PREFERRED EMBODIMENTS

Preferred embodiments of a waveform generation apparatus, a setup cycle correction method, and a semiconductor test apparatus according to the present invention will now be explained hereinafter with reference to the accompanying drawings.

[Setup Cycle Correction Method]

(I. Correction and Setting of Cycle Data)

A setup cycle correction method (a procedure of correcting and setting cycle data) according to this embodiment will be first explained with reference to FIG. 1.

This drawing is a flowchart showing a procedure of the setup cycle correction method.

A user specifies a RATE set value of each domain (each core) in an electronic device (a step 10). Further, the RATE set value of each domain is adjusted in such a manner that the respective domains can be synchronized with each other (a step 11).

Then, whether spurious noise occurs at a position where removal by a PLL (phase locked loop) 50 is impossible is judged with respect to the RATE set value of a domain of a target clock (a step 12).

If it is determined that the spurious noise occurs at this position as a result of the judgment, a correction arithmetic operation is executed (a step 13) to readjust the RATE set values of the respective domains so that the respective domains can be synchronized with each other (a step 14). The readjusted RATE set values are set in a cycle setter 12 (which will be explained later) in a pattern generator 10 of a waveform generation apparatus (a semiconductor test apparatus) 1 (a step 15).

On the other hand, if the spurious noise does not occur at that position, the correction arithmetic operation is not executed, and the RATE set values are set in the cycle setter 12 (a step 15).

(II. Correction Arithmetic Operation)

The correction arithmetic operation for a setup cycle will now be explained.

(II-1. Calculation of Position Where Spurious Noise Occurs)

A calculation method of positions where the spurious noise occurs will be first explained.

Figure 11:
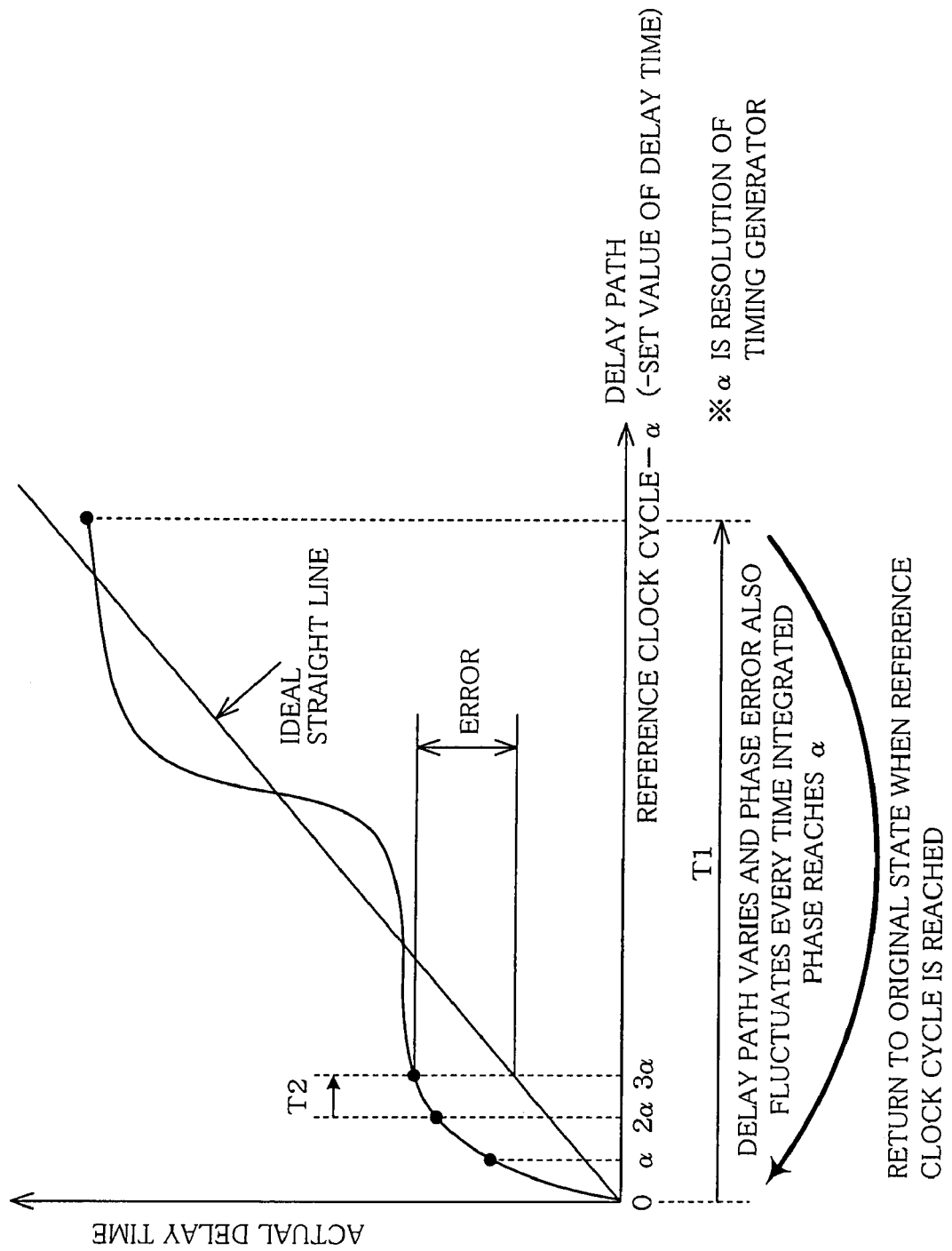
FIG. 11 is a waveform chart showing a fundamental principle of occurrence of spurious noise.

The positions where the spurious noise occurs (1/T1 and 1/T2) can be obtained from T1 and T2 in FIG. 11 as explained above.

Specifically, the positions are calculated based on the following expression.

$$1/T1 = 1/(a[\text{ns}] \times b[\text{ns}]/c1[\text{ns}]))  \quad \text{(Expression 1)}$$

$$1/T2 = 1/(a[\text{ns}] \times e[\text{ns}]/c2[\text{ns}]))  \quad \text{(Expression 2)}$$

Here, a is the slowest cycle of a high-precision variable clock (a clock signal) output from a timing generator 40.

b is a cycle of a reference clock that is input to the timing generator 40.

c1 is a phase of a cycle of cycle data with respect to an integral multiple of the reference clock cycle.

T1 is a cycle of spurious noise that occurs in the clock signal. Namely, this cycle is a phase fluctuation cycle. The reference clock cycle is divided by the phase, a quotient obtained by this division is multiplied by the cycle of the clock signal, and a product obtained by this multiplication is calculated as the cycle T1.

e is a resolution concerning a setup cycle of the timing generator 40.

c2 is a phase of a cycle of cycle data with respect to an integral multiple of the reference clock cycle.

T2 is a cycle of spurious noise that occurs in the clock signal. Namely, this cycle is a phase fluctuation cycle. A resolution of the timing generator is divided by the phase, a quotient obtained by this division is multiplied by the cycle of the clock signal, and a product obtained by this multiplication is calculated as the cycle T2.

(II-2. Correction of Position Where Spurious Noise Occurs)

Furthermore, in order to obtain a setup cycle that allows occurrence of spurious noise at a position where removal by the PLL 50 is possible, C1 or C2 that satisfies D in the following respective expressions is calculated.

$$1/T1 = 1/(A[\text{ns}] \times B[\text{ns}]/C1[\text{ns}])) > D[\text{Hz}]  \quad \text{(Expression 3)}$$

$$1/T2 = 1/(A[\text{ns}] \times E[\text{ns}]/C2[\text{ns}])) > D[\text{Hz}]  \quad \text{(Expression 4)}$$

These Expressions 3 and 4 satisfy that the position where the spurious noise occurs is a position where the spurious noise can be sufficiently removed by the PLL 50 under conditions that this position is closest to the carrier (when the setup cycle is maximum).

Here, A is the slowest cycle of a high-precision variable clock (the clock signal).

B is a cycle of a reference clock that is input to the timing generator 40.

C1 is a phase of a cycle of cycle data with respect to an integral multiple of the reference clock cycle (C1=$2^{-m}$). However, in Expression 3, C1 is calculated as a value satisfying D, and the cycle data is corrected based on a value of m in this C1.

D is a minimum value of a position where the spurious noise can be removed by the PLL 50.

E is a resolution concerning a setup cycle of the timing generator 40.

C2 is a phase of a cycle of cycle data with respect to an integral multiple of the reference clock cycle (C2=$2^{-n}$). However, in Expression 4, C2 is calculated as a value satisfying D, and the cycle data is corrected based on a value of n in this C2.

In Expressions 3 and 4, A is determined as the slowest cycle of the high-precision variable clock in order to assuredly enable removal of the spurious nose by the PLL 50.

That is, since the position of the spurious noise becomes farther from the carrier as the cycle indicated by A becomes faster, allowing occurrence of the spurious noise at a position far from the carrier when A indicates the slowest cycle of the high-precision variable clock enables assuredly removing the spurious noise by the PLL 50 irrespective of a cycle of the high-precision variable clock.

Further, in Expressions 3 and 4, ">D" is determined in order to set an inverse number of a cycle of a phase fluctuation that occurs in the timing generator 40 to be larger than a minimum value of a position where the spurious noise can be removed by the PLL 50.

As a result, the spurious noise can occur within a frequency range where removal by the PLL 50 is possible, thereby assuredly removing the spurious noise.

Furthermore, when the two arithmetic operations of Expressions 3 and 4 are executed, both the spurious noise that occurs due to T1 and the spurious nose that occurs due to T2 are allowed to occur at a position far from the carrier, thus enabling removal by the PLL.

Moreover, the cycle data is corrected based on C1 and C2 calculated based on Expressions 3 and 4.

"1" or "0" is input to the cycle setter 12 in the pattern generator 10 in accordance with each bit when the corrected cycle data is expressed as binary numbers. That is, it is good enough to set a bit corresponding to C1 (=$2^{-m}$) and a bit corresponding to C2 (=$2^{-n}$) in the binary notation in the cycle setter 12.

When the thus corrected cycle data is set in the pattern generator 10, the spurious noise that occurs in the clock signal is allowed to occur at a position far from a carrier of this clock signal. Additionally, in Expressions 3 and 4, since C1 or C2 is calculated under the condition ">D", the spurious noise occurs at a position where it can be removed by the PLL 50. Therefore, the spurious noise can be assuredly removed, thereby realizing low jitters of the clock signal.

(II-3. Specific Example of Correction Arithmetic Operation)

Specific examples of the correction arithmetic operation at the step 13 and adjustment of the RATE set value at the step 14 in the flowchart of FIG. 1 will now be explained.

It is assumed that a weight of an LSB (Less Significant Bit: a least significant bit when expressed in binary numbers) of the RATE set value is 2-28 ns, a cycle of the reference clock is 4 ns, a resolution concerning the setup cycle of the timing generator is $2^{-7}$ ns, and a position of the spurious noise that can be sufficiently removed by the PLL 50 is 40 kHz. It is to be noted that, when the position of the spurious noise is equal to or below 10 Hz, this position is not a target since it is too low.

Figure 2:
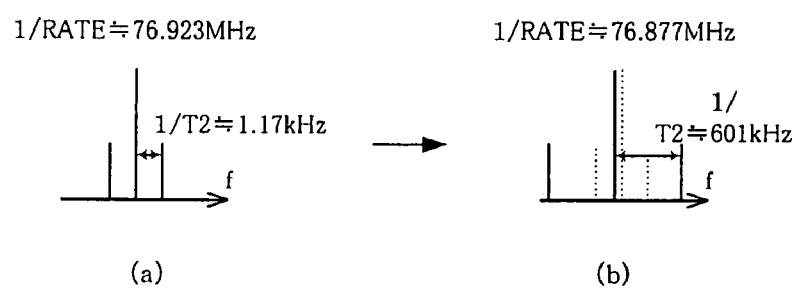
FIG. 2 is waveform charts showing positions where spurious noise occurs before and after correction.

The RATE set value is determined as the following value.
RATE=13.0000001192092 [ns]
(set value=0xd0000020)
1/RATE in this example is the following value.
1/RATE≈76.923 [MHz] (see FIG. 2(a))

Figure 12:
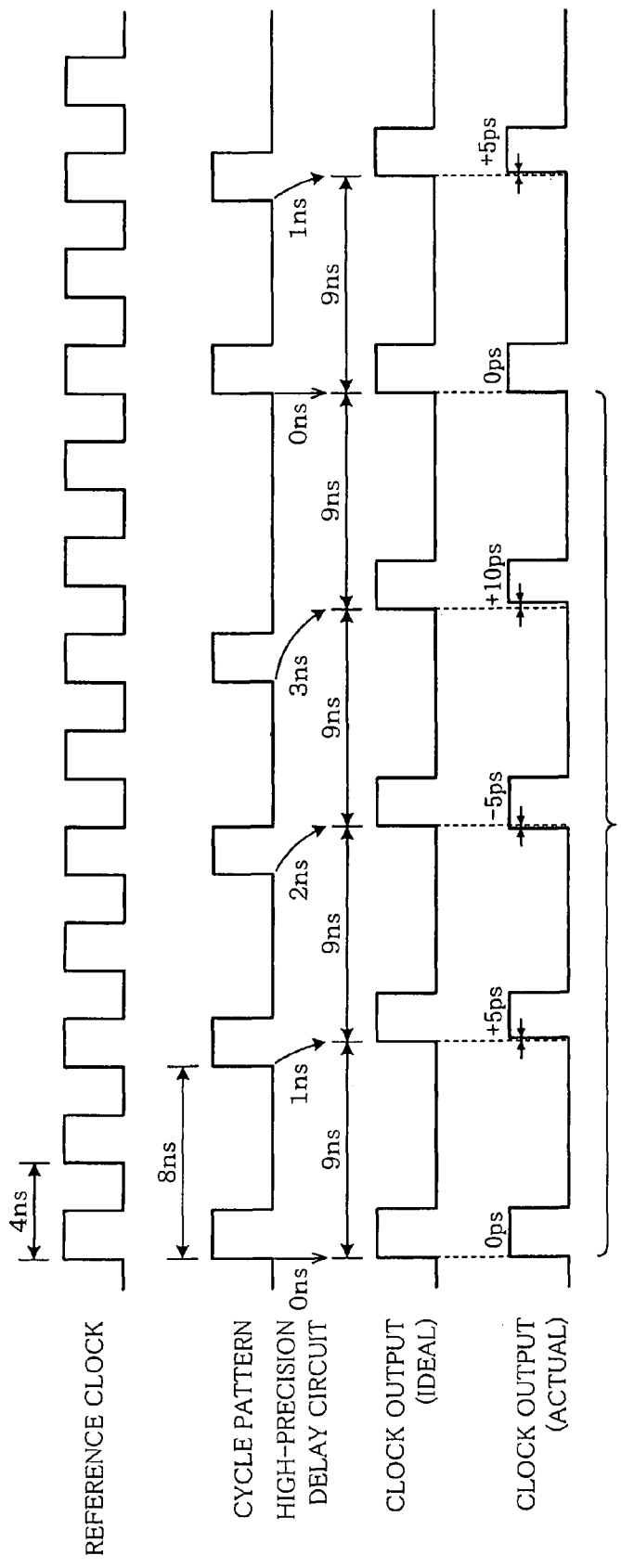
FIG. 12 is a waveform chart showing an operation of the timing generator when a reference clock cycle=4 ns and a cycle set value=9 ns.
Figure 13:
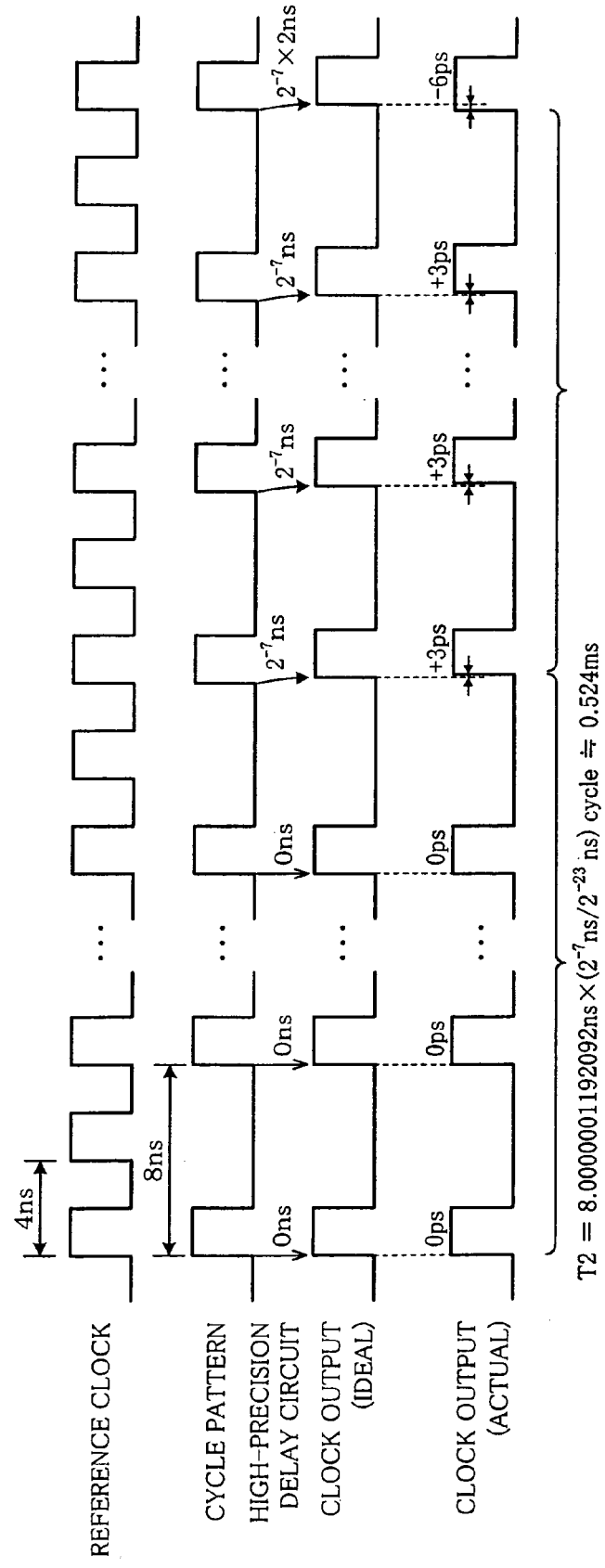
FIG. 13 is a waveform chart showing an operation of the timing generator when the reference clock cycle=4 ns and the cycle set value=8.0000001192092 ns.

Then, whether the spurious noise occurs at a position where removal by the PLL 50 is impossible is judged (the step 12 in FIG. 12). The position where the spurious noise occurs is calculated by using Expressions 3 and 4.

$$1/T1 = 1/(13 \text{ ns} \times 4 \text{ ns}/2^{-23} \text{ ns}) \approx 2.29 \text{ Hz}$$

$$1/T2 = 1/(13 \text{ ns} \times 2^{-7} \text{ ns}/2^{-23} \text{ ns}) \approx 1.17 \text{ Hz}$$

Here, as to 1/T1, although the spurious noise cannot be removed by the PLL 50 because 2.29 Hz<40 kHz, this position is not a target since it is <10 Hz and too low.

Oh the other hand, as to 1/T2, the spurious noise cannot be removed by the PLL 50 because 1.17 kHz<40 kHz, and this position is a problematic frequency.

Figure 1:
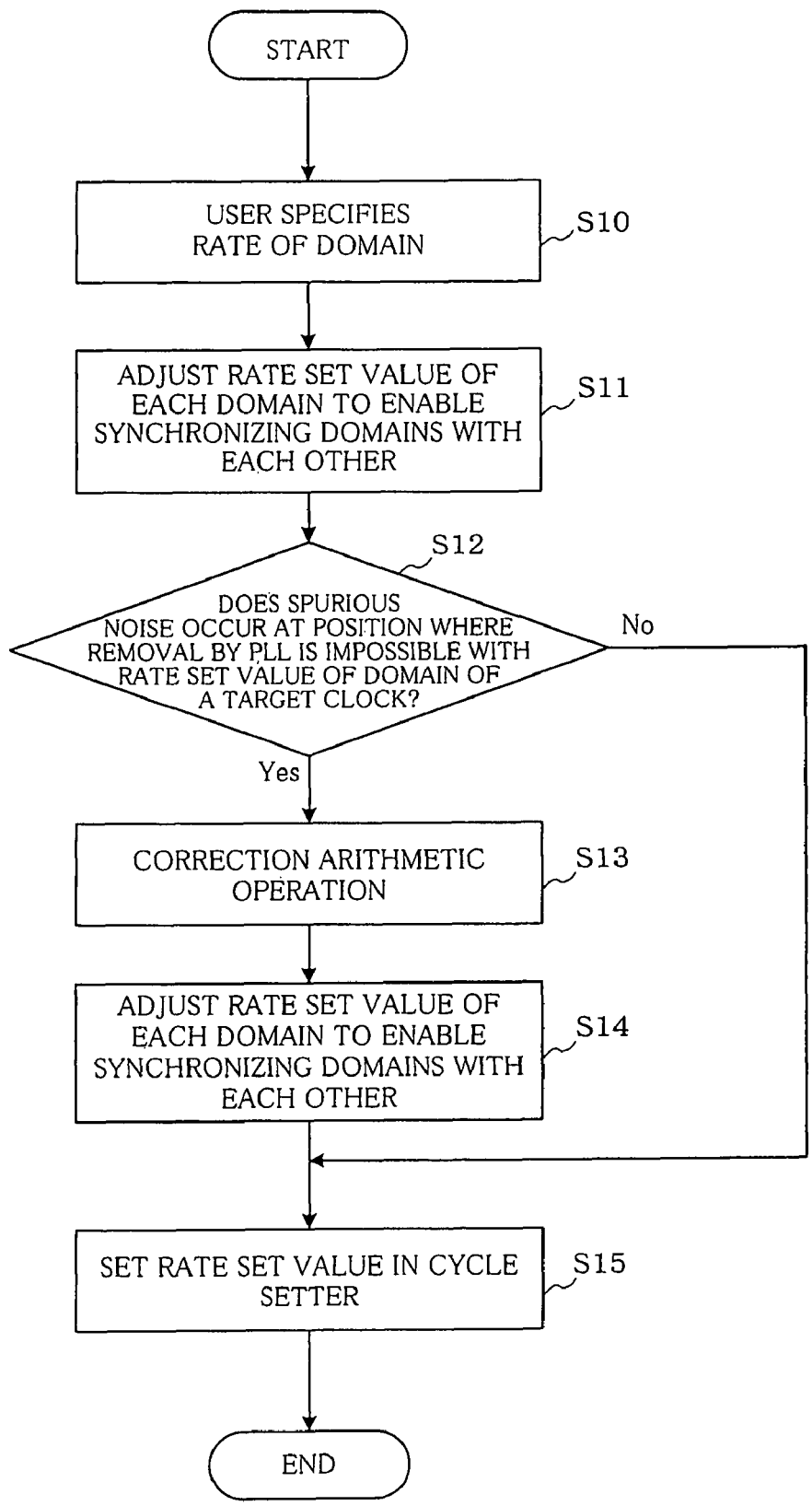
FIG. 1 is a flowchart showing an operation of a waveform generation apparatus according to the present invention.

When the correction arithmetic operation is performed in regard to 1/T2, the following expression can be obtained (the step 13 in FIG. 1).

RATE=13.0078736543655[ns]
(set value=0xd0204020)
1/RATE in this example has the following value.
1/RATE≈76.87651545 [MHz]
The RATE set value of each domain is readjusted.
RATE=13.0078741908073[ns]
(set value=0xd02040b0)
1/RATE in this example has the following value.
1/RATE≈76.87651228[MHz] (see FIG. 2(b)).

Moreover, 1/T1 and 1/T2 have the following values, respectively.

$$1/T1=1/(13\ ns \times 4\ ns/2^{-7}\ ns) \approx 150\ kHz$$

$$1/T2=1/(13\ ns \times 2^{-7}\ ns/2^{-4}\ ns) \approx 601\ kHz$$

In this example, each of 1/T1 and 1/T2 is >40 kHz. Therefore, the produced spurious noise can be removed by the PLL 50.

The thus obtained RATE set value is set as cycle data by the cycle setter 12 in the pattern generator 10.

In this embodiment, since the weight of the LSB in the RATE set value is $2^{-28}$ ns, upper four bits and lower 25 bits can be set as shown in FIG. 3.

Here, since m in 1/T1 is "−7" and n in 1/T2 is "−14", it is good enough to set a bit in each of $2^{-7}$ ns and $2^{-14}$ ns in the cycle setter 12.

As explained above, according to the setup cycle correction method of this embodiment, since the cycle data is corrected in such a manner that a position where the spurious noise occurs become far from the carrier, this spurious noise can be assuredly removed by the PLL. Therefore, jitters of the high-precision variable clock can be reduced.

[Waveform Generation Apparatus and Semiconductor Test Apparatus]

Embodiments of a waveform generation apparatus and a semiconductor test apparatus that carry out the setup cycle correction method according to the present invention will now be explained with reference to FIGS. 4 to 7.

Figure 4:
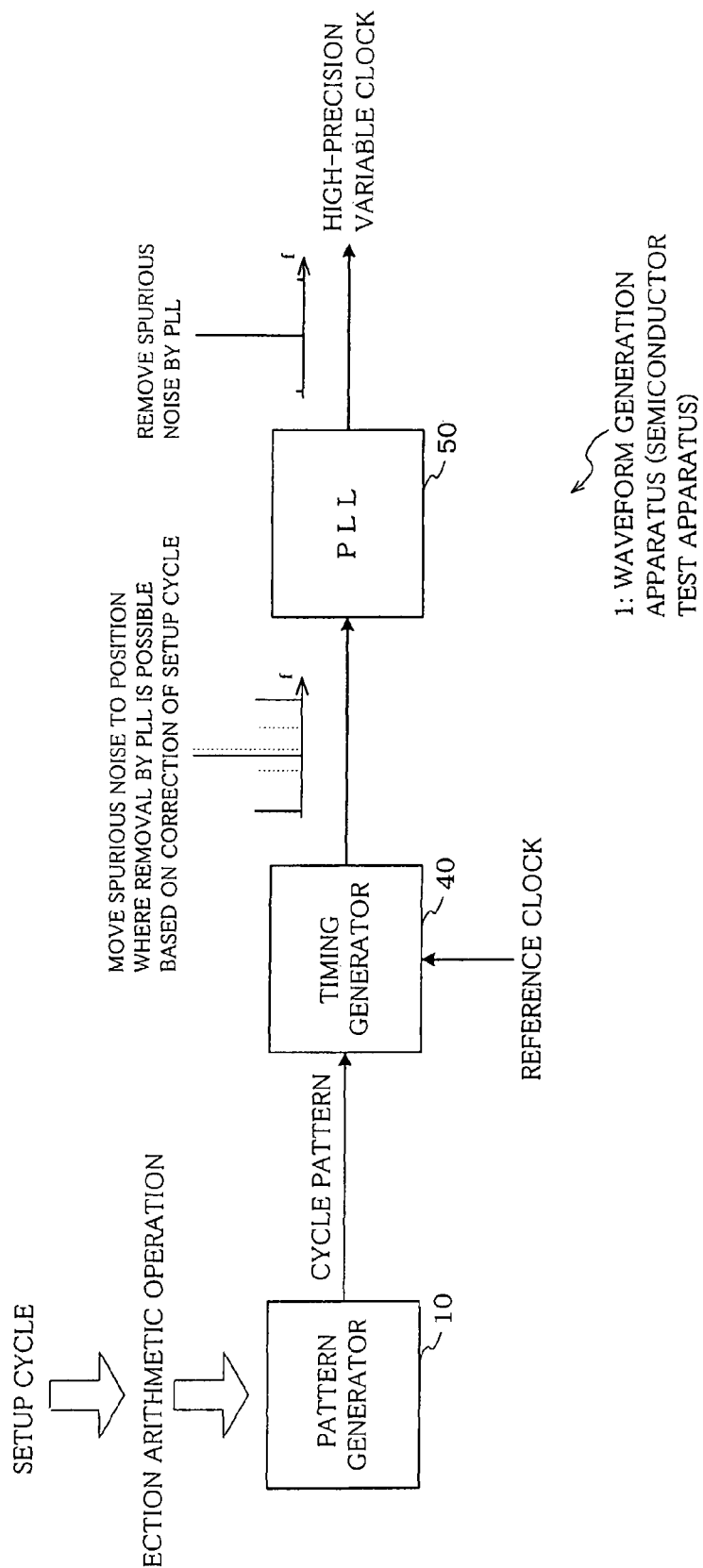
FIG. 4 is a block diagram showing a structure of the waveform generation apparatus according to the present invention.
Figure 5:
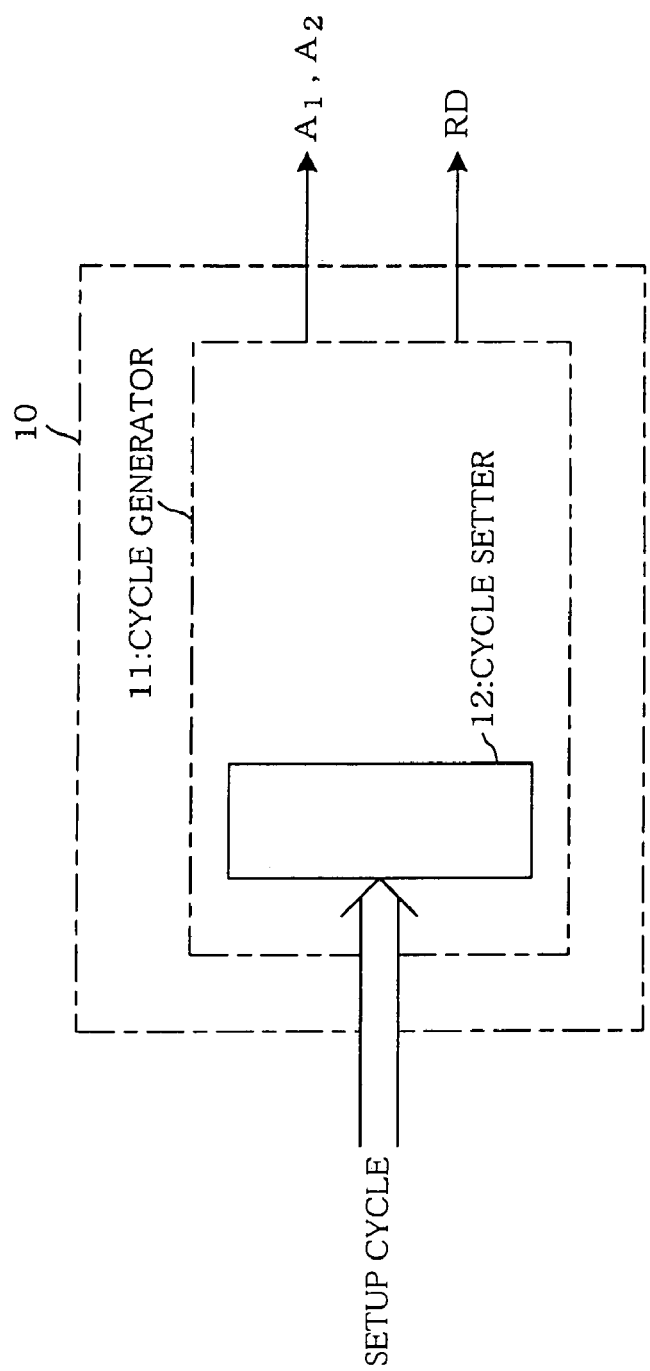
FIG. 5 is a block diagram showing a structure of a pattern generation according to the present invention.
Figure 6:
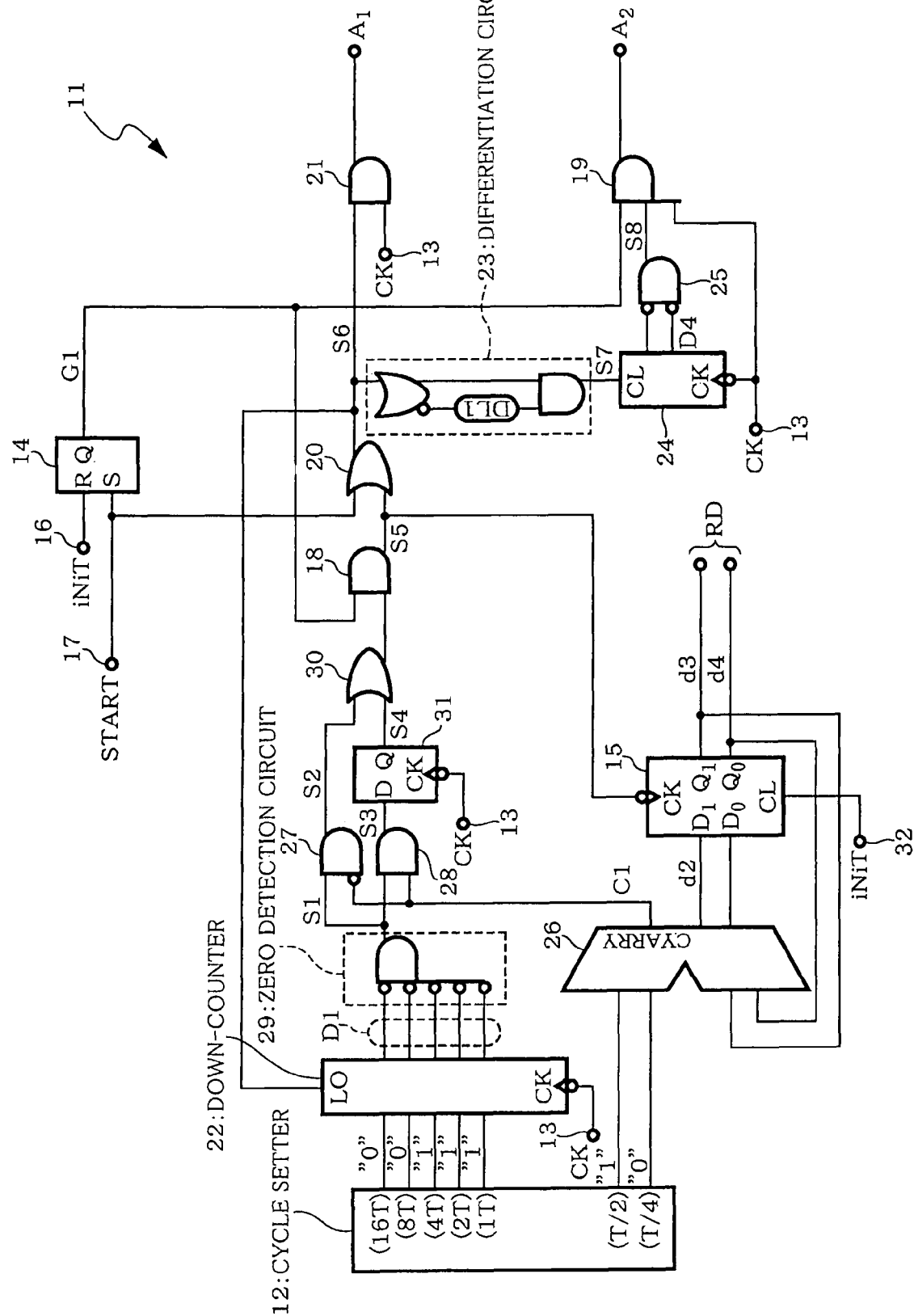
FIG. 6 is a circuit diagram showing a structure of a cycle generator in the pattern generator.
Figure 7:
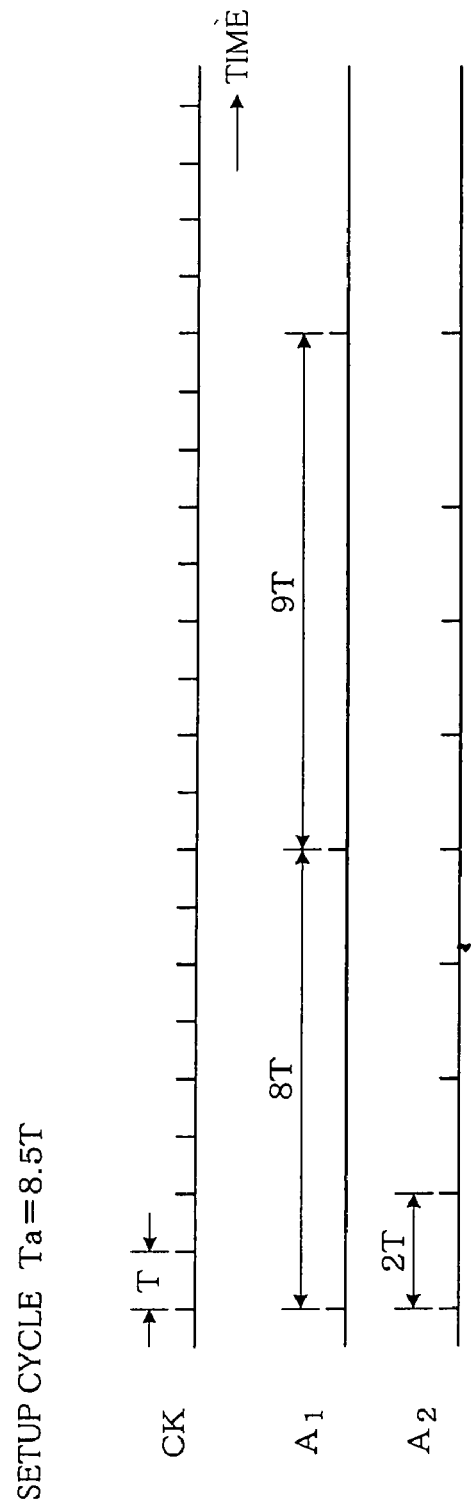
FIG. 7 is a waveform chart showing a displacement of a signal at each portion in the pattern generator.

FIG. 4 is a block diagram showing a structure of a semiconductor test apparatus according to this embodiment, FIG. 5 is a block diagram showing a structure of a pattern generator, FIG. 6 is a block diagram showing a structure of a cycle generator, and FIG. 7 is a waveform chart showing a state of a signal in each portion in the pattern generator.

It is to be noted that the waveform generation apparatus is mounted in the semiconductor test apparatus to perform a multitime domain test.

As shown in FIG. 4, a waveform generation apparatus (a semiconductor test apparatus) 1 includes a pattern generator 10, a timing generator 40, and a PLL 50.

Here, the pattern generator 10 includes a cycle generator 11 as shown in FIG. 5.

As shown in FIGS. 5 and 6, the cycle generator 11 outputs a pulse $A_1$ having a cycle that is m-fold (m is a positive integer) of a cycle T of a reference clock at a terminal 13 and a pulse $A_2$ having a cycle that is p-fold (p is a positive integer smaller than m) of the cycle T in accordance with setup cycle data.

For example, as shown in FIG. 7, when the a setup cycle Ta is 8.5 T, a cycle mT of the pulse $A_1$ alternately takes 8 T and 9 T, and a cycle pT of the pulse $A_2$ is 2 T.

Additionally, the cycle generator 11 outputs a micro cycle data RD indicative of a delay amount smaller than the cycle T in accordance with lower data of a weight of the cycle T or a smaller cycle of the setup cycle data and a generation state of the pulse $A_1$.

It is to be noted that the pulse $A_1$ and the micro cycle data RD output from the cycle generator 11 are generally represented as follows.

That is, a cycle of the pulse $A_1$ is obtained as follows. A sum total of a first setup cycle to an i+1th (i is an integer equal to or above 1) setup cycle of a timing pulse generated from this waveform generation apparatus 10 is divided by the cycle T to provide a value M1. A sum total (zero when i=1) of the first to an ith setup cycles of the timing pulse is divided by T to provide a value M2. A value obtained by subtracting an integer part of the value M2 from an integer part of the value M1 is multiplied by T, and a result is the cycle of the pulse $A_1$. A decimal part of M2 is the micro data RD.

This cycle generator 11 is configured as shown in FIG. 6. That is, the cycle setter 12 sets cycle data indicative of a cycle which should be generated. A bit number having a weight that is equal to or above the cycle T in the cycle data is determined as n1 and a bit number having a weight that is less than T is determined as n2.

FIG. 6 shows a weight of each bit when n1=5 and n2=2. In this example, a value obtained by subtracting T from the cycle which should be generated is set in the cycle setter 12. In an example depicted in FIG. 7, the cycle which should be generated is 8.5 T, and "0011110" is set in accordance with this cycle as shown in FIG. 6.

It is to be noted that n1=5 and n2=2 are set in FIGS. 6 and 7, but the present invention is not restricted thereto, and arbitrary preferable values can be set.

An RS-FF 14 and a D-type FF 15 having n2 bits are reset by using an initialization signal iNi from a terminal 16 in advance.

When an activation signal START is supplied to a terminal 17, the RS-FF14 is set, its Q output indicated by G1 is changed to a high level, and gates 18 and 19 are opened based on the output G1. Further, the activation signal START is supplied to an OR gate 20, a gate 21 is opened based on an output S6 from this gate, and one of reference clocks CK is output as a pulse A1 from a terminal 13 by the gate 21.

Furthermore, the output S6 from the OR gate 20 is input to a load terminal LO of a down-counter 22 having n1 bits, upper bits n1 in the cycle setter 12 are preset in accordance with a falling edge of the reference clock CK in a state where the signal S6 from the terminal LO is supplied, and 7 is output from the down-counter 22 as counting contents D1 in this example. Then, the down-counter 22 counts down at the falling edge of each clock CK.

The output S6 from the OR gate 20 is also supplied to a differentiation circuit 23, a counter 24 is cleared based on an output S7 from the differentiation circuit 23, and an output D4 from this counter 24 becomes zero. The counter 24 multiplies a cycle of a pulse A2 by p. In this example, p=2, and a signal S8 having a width T is output from an AND gate 25 every time the counter 24 counts the two reference clocks CK. This signal S8 is supplied to the gate 19, and an output obtained by combining signals G1 and S8 and the clock CK is obtained as a pulse $A_2$.

Lower bits of n2 in setup cycle data of the cycle setter 12 are supplied to an n2 bit adder 26, added to an output from the D-FF 15, and an addition output is supplied to data terminals D0 and D1 of the D-FF 15. In this example, n2=2, and the adder 26 is a two-bit adder. A carry output C1 from the adder 26 is inverted and supplied to a gate 27, and supplied to a gate 28 without being inverted. In an initial state, the D-FF 15 is reset, and its output is 0. Therefore, the carry output C1 is 0, and the gate 27 is opened. Furthermore, an output d2 of upper bits in a two-bit output from the adder 26 is at the high level since lower two bits in the setup cycle data are 1 and 0 in this example.

The D-FF 15 fetches the output from the adder 26 at a falling edge of an output S5 from the gate 18, and it produces an output as micro cycle data RD of the cycle generator 11. The D-FF 15 and the adder 26 constitute an accumulation adding circuit.

In this example, when the down-counter 22 counts the seven clocks CK and its count value D1 becomes 0, a zero detection circuit 29 produces an output S1, this output passes through the gate 27 and is further supplied to the gate 18 through an OR gate 30 as a signal S2, and an output S5 from the gate 18 is supplied to an OR gate 20. Therefore, the gate 21 outputs one of the clocks CK which is 8 T separated as the pulse A1, the differentiation circuit 23 produces an output to clear the counter 24, and setup cycle data is preset in the down-counter 22.

The D-FF 15 fetches an output from the adder 26 at a falling edge of the output S5 from the gate 18, and an output from the D-FF 15 becomes d3=1 and D4=0, and its upper bit output d3 is changed to the high level. Therefore, an output from the adder 26 becomes 0, and the carry output C1 is changed to the high level when the output from the adder 26 becomes 0, and an output d2 from the adder 26 is changed to a low level.

Although the same operation is carried out in this state, the output S1 from the detection circuit 29 passes through the gate 28 when a count value of the down-counter 22 becomes zero next, thereby producing an output S3. This output is fetched into a D-FF 31 based on the next clock CK, and an output S4 from the D-FF 31 is supplied to the gate 18. Therefore, the pulse A1 is produced from the gate 21 like the above, this pulse A1 is 9 T from the previous pulse A1.

Furthermore, fetching into the D-FF 15 is carried out, and its output d3 is changed to the low level. As a result, the output d2 from the adder 26 is changed to the high level, thus returning to the initial state. Therefore, the same operation is repeated, and the cycle of the pulse A1 repeats 8 T and 9 T, its synchronization with the pulse A2 becomes 2 T, and the micro cycle data RD repeats the outputs d3=0 and d4=0 (0 T) and the outputs d3=1 and d4=0 (0.5 T) in the cycles of 8 T and 9 T.

The timing generator 40 has delay circuits 41-1 to 41-n in units of reference clocks and a high-precision variable delay circuit 42.

Figure 9:
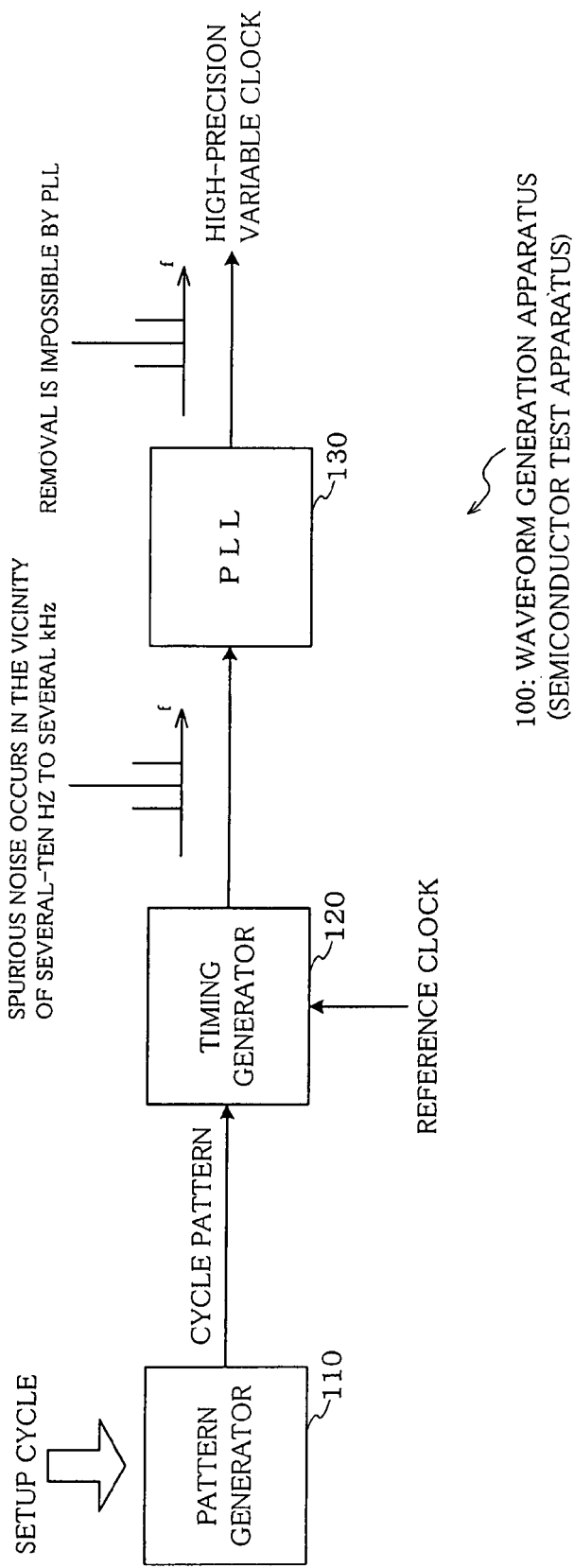
FIG. 9 is a block diagram showing a structure of a conventional waveform generation apparatus (a semiconductor test apparatus)
Figure 10:
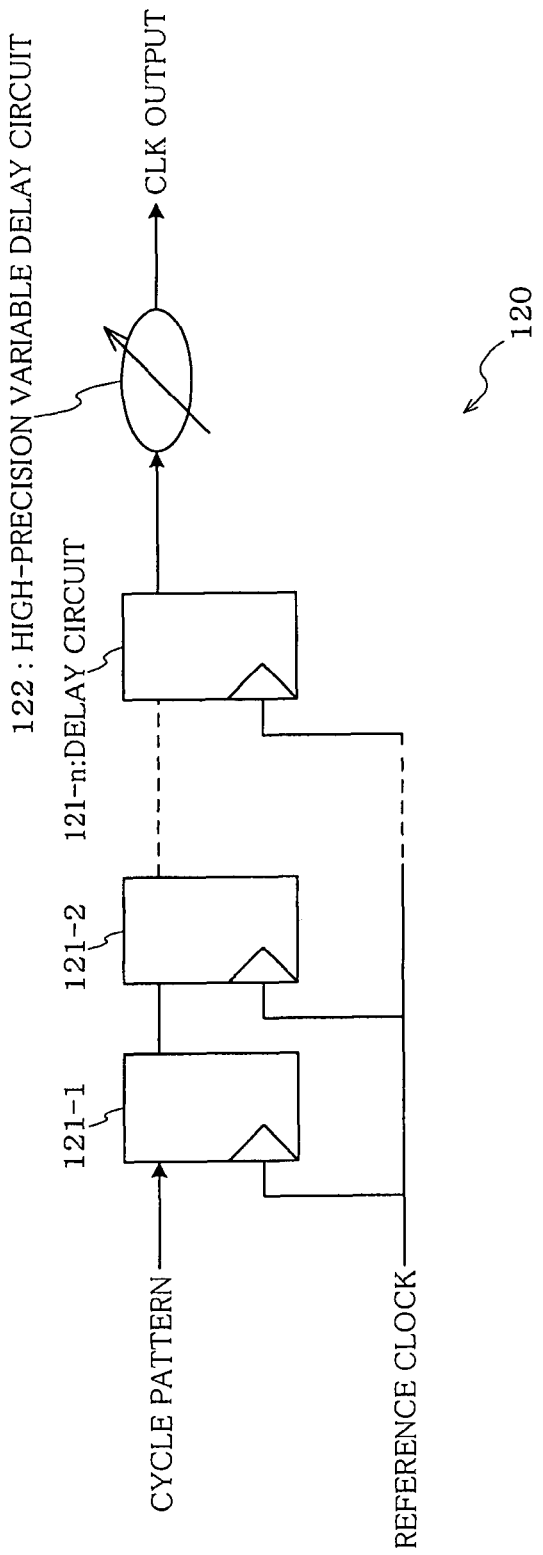
FIG. 10 is a circuit diagram showing a structure of a timing generator.

Since this structure is the same as that of the conventional timing generator 120 depicted in FIG. 9, its explanation will be omitted here. It is to be noted that a reference clock that is a reference for an output timing of a high-precision variable clock is input to the timing generator 40.

Figure 8:
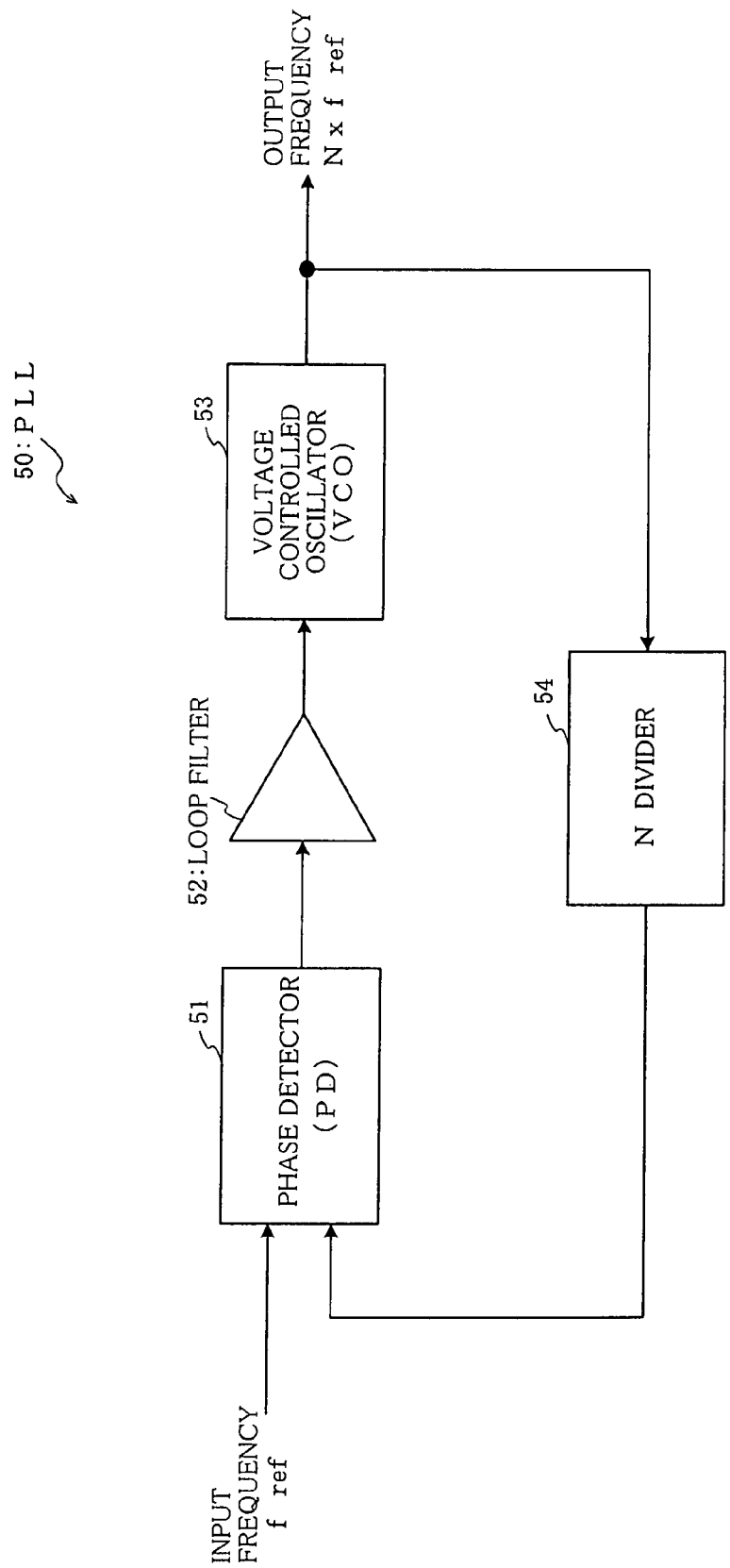
FIG. 8 is a block diagram showing a structure of a PLL.

As shown in FIG. 8, the PLL 50 includes a phase detector 51, a loop filter 52, a voltage controlled oscillator 53, and an N divider 54.

The phase detector 51 outputs a phase difference between a reference frequency signal and an output signal from the N divider in the form of a voltage (or a current).

The loop filter 52 determines a time constant of the PLL 50.

The voltage controlled oscillator 53 controls an output frequency by using a voltage.

The N divider 54 divides a frequency of an output signal and supplies a divided frequency to an input side.

That is, the PLL 50 constitutes a feedback loop in which an output follows up a phase fluctuation in an input in such a manner that the output is returned to the phase detector 51 of the input and a phase difference between the input and the output is eliminated.

Here, since the loop filter 52 is a low-pass filter, a phase fluctuation (spurious noise far from a carrier) having a faster frequency tends to be attenuated by the filter, and its output is hard to be followed up. Therefore, the spurious noise in the input is consequently removed.

As explained above, according to the waveform generation apparatus, the setup cycle correction method, and the semiconductor test apparatus of this embodiment, since cycle data is corrected in such a manner that a position where spurious noise occurs becomes far from a carrier, this spurious noise can be assuredly removed by the PLL, thereby realizing low jitters in the high-precision variable clock.

Although the preferable embodiments of the waveform generation apparatus, the setup cycle correction method, and the semiconductor test apparatus according to the present invention have been explained above, the waveform generation apparatus, the setup cycle correction method, and the semiconductor test apparatus according to the present invention are not restricted to the foregoing embodiments, and various modifications can be carried out within the scope of the present invention.

For example, although removal of the spurious noise has been explained in the foregoing embodiments, the present invention can be also applied to removal of noise that occurs with, e.g., a fixed frequency or cycle.

Moreover, in the setup cycle correction method according to the present invention, its correction arithmetic operation can be formed as a program to be executed by an arithmetic operation device. In this case, this arithmetic operation device can be connected with the pattern generator in the waveform generation apparatus to input cycle data corrected by the arithmetic operation device to the pattern generator.

Since the present invention is an invention concerning removal of spurious noise, it can be applied to an apparatus or a device that outputs a signal in which spurious noise occurs.

What is claimed is:

1. A waveform generation apparatus comprising:
   a pattern generator that generates a cycle pattern;
   a timing generator that outputs a clock signal based on the cycle pattern and a reference clock; and
   a phase-locked loop circuit that removes spurious noise from the clock signal,
   wherein the pattern generator has a cycle setter that sets a generation cycle of the clock signal as cycle data, and
   wherein the cycle setter sets cycle data corrected in such a manner that a position of the spurious noise which occurs when the clock signal has the slowest cycle becomes a position where removal of the spurious noise by the phase-locked loop circuit is possible.

2. The waveform generation apparatus according to claim 1,
   wherein the cycle setter sets cycle data corrected in such a manner that an inverse number of a cycle of a phase fluctuation which occurs in the timing generator becomes larger than a minimum value of a position where the spurious noise is removable by the phase-locked loop circuit.

3. The waveform generation apparatus according to claim 2,
wherein a cycle of a reference clock that is input by the timing generator and serves as a reference for an output timing of the clock signal is determined as a reference clock cycle,
a phase of a cycle of the cycle data with respect to an integral multiple of the reference clock cycle is calculated, and
the reference clock cycle is divided by the phase, a quotient obtained by the division is multiplied by the cycle of the cycle data, and a product obtained by the multiplication is determined as a cycle of the phase modulation.

4. The waveform generation apparatus according to claim 3,
wherein the cycle data is corrected based on a value of C1 when a position (1/T1) of the spurious noise that occurs in the clock signal satisfies the following expression:

$$1/T1 = 1/(A \times B/C1) > D$$

where A: the slowest cycle of the clock signal
B: the reference clock cycle
C1: the phase
D: a minimum value of a position where the spurious noise is removable by the phase-locked loop circuit.

5. The waveform generation apparatus according to claim 2,
wherein a cycle of a reference clock that is input by the timing generator and serves as a reference for an output timing of the clock signal is determined as a reference clock cycle,
a phase of a cycle of the cycle data with respect to an integral multiple of the reference clock cycle is calculated, and
a resolution concerning a setup cycle of the timing generator is divided by the phase, a quotient obtained by the division is multiplied by the cycle of the cycle data, and a product obtained by the multiplication is determined as a cycle of the phase fluctuation.

6. The waveform generation apparatus according to claim 5,
wherein the cycle data is corrected based on a value of C2 when a position (1/T2) of the spurious noise that occurs in the clock signal satisfies the following expression:

$$1/T2 = 1/(A \times E/C2) > D$$

where A: the slowest cycle of the clock signal
E: the resolution concerning the setup cycle of the timing generator
C2: the phase
D: a minimum value of a position where the spurious noise is removable by the phase-locked loop circuit.

7. A setup cycle correction method of correcting cycle data that is set by a pattern generator in a waveform generation apparatus,
wherein the cycle data is corrected in such a manner that spurious noise which occurs in a clock signal output from a timing generator in the waveform generation apparatus is produced at a position where the spurious noise is removable by a phase-locked loop circuit in the waveform generation apparatus, and the corrected cycle data is set in the pattern generator.

8. A semiconductor test apparatus including a waveform generation apparatus that outputs a clock signal with a predetermined cycle,
wherein the waveform generation apparatus is comprised of:
a pattern generator that generates a cycle pattern;
a timing generator that outputs a clock signal based on the cycle pattern and a reference clock; and
a phase-locked loop circuit that removes spurious noise from the clock signal,
wherein the pattern generator has a cycle setter that sets a generation cycle of the clock signal as cycle data, and
wherein the cycle setter sets cycle data corrected in such a manner that a position of the spurious noise which occurs when the clock signal has the slowest cycle becomes a position where remove of the spurious noise by the phase-locked loop circuit is possible.

* * * * *